United States Patent
Smith et al.

(10) Patent No.: US 10,218,362 B2
(45) Date of Patent: Feb. 26, 2019

(54) METHOD AND APPARATUS FOR SUBSTATION FINGERPRINTING

(71) Applicant: Enphase Energy, Inc., Petaluma, CA (US)

(72) Inventors: Benjamin Lewis Smith, Petaluma, CA (US); Daniel Lewis, San Francisco, CA (US)

(73) Assignee: Enphase Energy, Inc., Petaluma, CA (US)

( * ) Notice: Subject to any disclaimer, the term of this patent is extended or adjusted under 35 U.S.C. 154(b) by 686 days.

(21) Appl. No.: 14/644,865

(22) Filed: Mar. 11, 2015

(65) Prior Publication Data

US 2015/0263738 A1    Sep. 17, 2015

Related U.S. Application Data

(60) Provisional application No. 61/952,329, filed on Mar. 13, 2014.

(51) Int. Cl.
| | |
|---|---|
| H03L 5/02 | (2006.01) |
| H02J 3/38 | (2006.01) |
| H02J 3/00 | (2006.01) |

(52) U.S. Cl.
CPC .............. *H03L 5/02* (2013.01); *H02J 3/381* (2013.01); *H02J 2003/007* (2013.01); *Y02E 60/76* (2013.01); *Y04S 40/22* (2013.01)

(58) Field of Classification Search
None
See application file for complete search history.

(56) References Cited

U.S. PATENT DOCUMENTS

| | | |
|---|---|---|
| 2009/0200994 A1 | 8/2009 | Fornage |
| 2013/0036311 A1 | 2/2013 | Akyol et al. |
| 2013/0262197 A1 | 10/2013 | Kaulgud et al. |
| 2013/0264874 A1 | 10/2013 | Ropp |

FOREIGN PATENT DOCUMENTS

WO    WO-2010045726 A1    4/2010

OTHER PUBLICATIONS

Hadjsaid et al. "Dispersed generation increases the complexity of controlling, protecting, and maintaining the distribution system", IEEE Computer Applications in Power, 1999.*
Kato et al., "Multi-Agent Based Control and Protection of Power Distribution System—Protection Scheme with Simplified Information Utilization", 2005 ISAP.*
International Search Report and Written Opinion dated May 28, 2015 for PCT Application No. PCT/US2015/020072.

* cited by examiner

*Primary Examiner* — Carlos R Ortiz Rodriguez
(74) *Attorney, Agent, or Firm* — Moser Taboada

(57) ABSTRACT

A method and apparatus for mapping distributed generators (DGs) to corresponding power grid feeder lines. In one embodiment, the method comprises obtaining grid data pertaining to a power grid that comprises a plurality of feeder lines; obtaining, for each distributed generator (DG) of a plurality of DGs coupled to the plurality of feeder lines, DG data pertaining to the DG; and determining, based on the grid data and the DG data, a mapping that identifies to which feeder line of the plurality of feeder lines each of the DGs of the plurality of DGs is coupled.

20 Claims, 4 Drawing Sheets

US 10,218,362 B2

METHOD AND APPARATUS FOR SUBSTATION FINGERPRINTING

CROSS-REFERENCE TO RELATED APPLICATIONS

This application claims benefit of U.S. provisional patent application Ser. No. 61/952,329, entitled "Substation Fingerprinting" and filed Mar. 13, 2014, which is herein incorporated in its entirety by reference.

BACKGROUND OF THE INVENTION

Field of the Invention

Embodiments of the present disclosure relate generally to determining a mapping of distributed generators (DGs) to power distribution feeder lines.

Description of the Related Art

Power distribution systems are prevalent throughout most countries for delivering power generated at a commercial power plant to consumers. Power distribution systems generally include high-voltage transmission lines for distributing generated power to one or more distribution centers, or substations, where the high-voltage is stepped down to a lower voltage and distributed further to consumers via feeder lines.

As the use of distributed generators (DGs) for power generation from renewable energy sources continues to rise, more and more buildings that are connected to commercial feeder lines also have a local DG that is coupled to the commercial feeder line. Generally, detailed data regarding the exact layout of DGs to feeder lines (e.g., specifically which feeder line each DG is coupled to) as well as actual power production contributed by the DGs to the feeder line does not exist. As such, some feeder lines may be incorrectly considered over-subscribed and closed to the addition of more DGs.

Therefore, there is a need in the art for a method and apparatus for determining which DGs are coupled to which feeder lines.

SUMMARY OF THE INVENTION

Embodiments of the present invention generally relate to determining a mapping of DGs to feeder lines as shown in and/or described in connection with at least one of the figures, as set forth more completely in the claims.

These and other features and advantages of the present disclosure may be appreciated from a review of the following detailed description of the present disclosure, along with the accompanying figures in which like reference numerals refer to like parts throughout.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
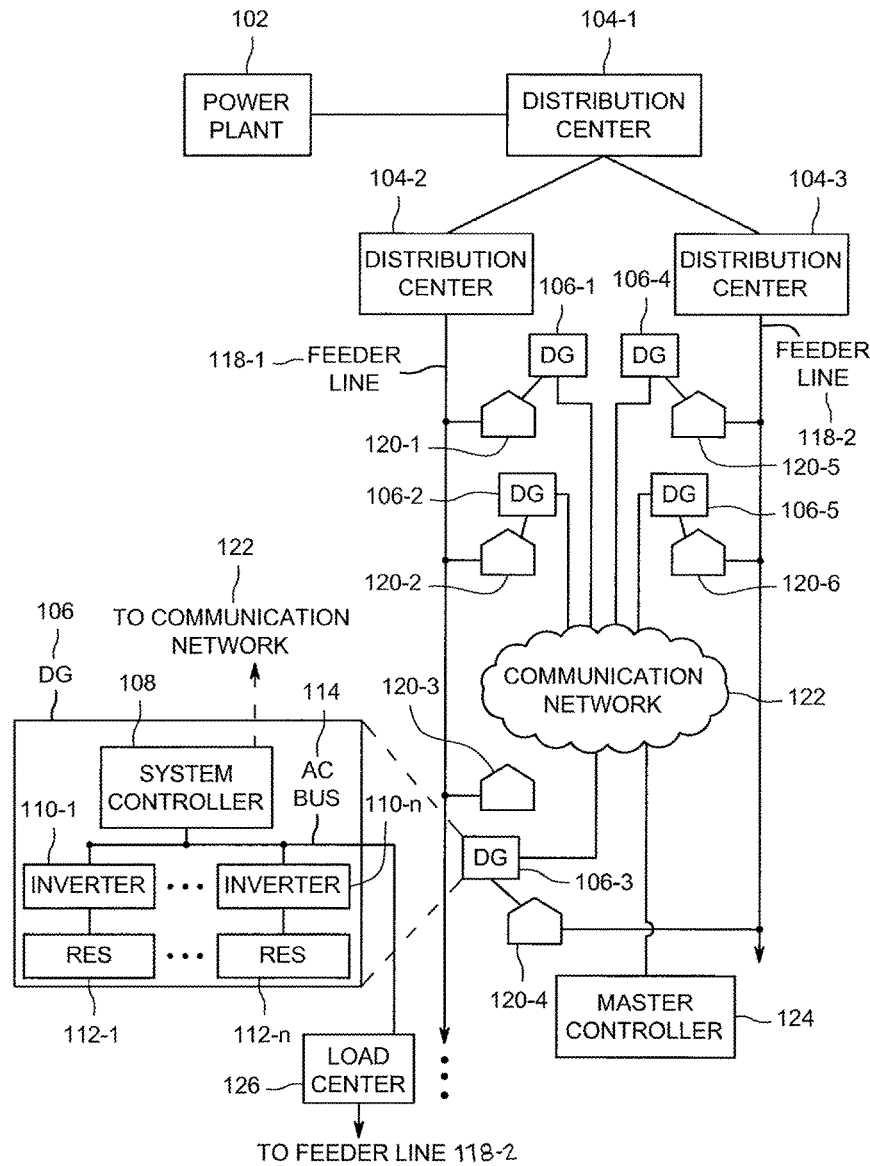
FIG. 1 is a block diagram of a system for power distribution in accordance with one or more embodiments of the present invention.

FIG. 1 is a block diagram of a system 100 for power distribution in accordance with one or more embodiments of the present invention. This diagram only portrays one variation of the myriad of possible system configurations. The present invention can function in a variety of environments and systems.

The system 100 comprises a power grid comprising a power plant 102 (such as a commercial power plant) coupled by high-voltage transmission lines to a first distribution center 104-1, which is further coupled to distribution centers (i.e., substations) 104-2 and 104-3. Although three distribution centers are depicted in FIG. 1, the system 100 may comprise fewer or more distribution centers in other embodiments. The distribution centers 104-2 and 104-3, which step-down the voltage levels received from the distribution center 104-1, are coupled to feeder lines 118-1 and 118-2, respectively. The feeder lines 118-1 and 118-2 are each coupled to a plurality of buildings 120 (i.e., buildings 120-1 through 120-3 are coupled to feeder line 118-1, and buildings 120-4 through 120-6 are coupled to feeder line 118-2), such as residential and/or commercial buildings, for providing power to the buildings 120. As depicted in FIG. 1, a geographical grouping of buildings 120 may not necessarily be coupled to the same feeder line 118. For example, in a local neighborhood comprising buildings 120-1 through 120-4, buildings 120-1, 120-2 and 120-3 may each be coupled to feeder line 118-1 while building 120-4 is coupled to feeder line 118-2.

A subset of the buildings 120 are each coupled to a corresponding distributed generator (DG) 106 that generates AC power from a renewable energy source (RES). For example, buildings 120-1, 120-2, 120-4, 120-5 and 120-6 are coupled to DGs 106-1, 106-2, 106-3, 106-4 and 106-5, respectively. Each DG 106 comprises a plurality of DC-AC inverters 110-1 through 110-$n$ coupled to RESs 112-1 through 112-$n$, respectively, although in other embodiments multiple RESs 112 may be coupled to one or more of the inverters 110 (e.g., a single, centralized inverter for the DG 106). The RESs 112 may be any type of system for generating DC power from a renewable form of energy, such as wind, solar, hydro, and the like. In certain embodiments, each RES 112 is a photovoltaic (PV) module. The inverters 110 generate AC power from the corresponding RES 112 and couple the generated power to an AC bus 114. The DG 106 depicted in FIG. 1 comprises "n" inverters/RESs; however, each DG 106 (i.e., DG 106-1 through 106-5) may comprise different numbers of inverters 110 and/or RESs 112.

The AC bus 114 from each DG 106 is coupled to the corresponding feeder line 118 via a load center 126 which may be located in or proximate the corresponding building 120. The inverters 110 generate AC power that is commercial power grid compliant and couple the generated AC power to the corresponding feeder line 118 via the AC bus 114/load center 126.

For each DG 106, a system controller 108 is coupled to the AC bus 114 and communicates with the inverters 110 (e.g., via power line communications (PLC) or other types of wired and/or wireless techniques). The system controller 108 may send command and control signals to one or more of the inverters 110 and/or receive data (e.g., status information, data related to power conversion, and the like) from one or more of the inverters 110. The system controller 108 is further coupled, by wireless and/or wired techniques, to a communication network 122 (e.g., the Internet). In some embodiments, the system controller 108 may be coupled to the communication network 122 via a commercially available router.

The system controller 108 is additionally communicatively coupled to a master controller 124 via the communications network 122 for sending information to/receiving information from the master control 124 (e.g., information related to the DG 106, information related to the corresponding feeder line 118, and the like). The master controller 124 may utilize wired and/or wireless techniques for coupling to the communications network 122. The master controller 124 may manage each of the DGs 106, control the operation of the inverters 110, and receive data regarding the health and/or performance of the inverters 110 (such as power generated, voltage generated, current generated, alarm information, alert information, status information, and the like) as well as the feeder lines 118 (such as line voltage, line frequency, and the like) from the system controller 108. The master controller 124 may store some or all of the information it receives for subsequent data analysis and/or report generation; additionally or alternatively, the system controller 108 may store all or some of such data and communicate the stored data to the master controller 124 (e.g., upon request by the master controller 124). The master controller 124 may be part of a Network Operations Center (NOC) for monitoring and managing the DGs 106.

In accordance with one or more embodiments of the present invention, data from the DGs 106 along with corresponding geographical data is correlated for determining signatures, or fingerprints, unique to those DGs 106 on a particular feeder line 118. Such substation fingerprinting thus provides a mapping of DGs 106 to their corresponding feeder lines 118. Geographical data, such as street addresses obtained during DG commissioning and longitude/latitude data generated from the street addresses, may be used in identifying those DGs 106 that are physically close to one another experiencing the same grid events. For example, the geographical data may be used during data analysis and correlation to filter out events occurring within the same time window that have similar signatures but generated in a different geographical region.

In one embodiment, each inverter 110 periodically (e.g., on the order of every 5 minutes, where such interval is, in some embodiments, user-settable) reports data to the master controller 124 via the corresponding system controller 108 for use in the correlation. Such reported data may include one or more of AC line voltage, AC line frequency, AC current generated, or AC power generated for use in such correlation. The periodically reported data may be time-stamped by the inverter 110, the system controller 108, or the master controller 124 for identifying when the measurement/data was obtained; additionally or alternatively, some or all of the periodically reported data may be "binned" into groups for certain periods of time.

In addition to the periodically reported data, status messages reported by the inverters 110 (such as alarm messages generated due to various grid conditions on the corresponding feeder line) as well as corresponding geographical data may be used in such correlation. In some embodiments, status messages generated by the inverters 110 due to grid perturbances (such as an 'AC voltage out-of-range' message from one or more inverters 110 due to a sudden large drop in grid voltage) are correlated in a first-order filtering for identifying potential groupings of DGs 106 coupled to feeder lines 118-1 and 118-2. By analyzing such grid-event data over time, a sufficient number of random events occur to potentially associate DGs 106 to various feeder lines 118 for a rough mapping. Since some grid events may impact multiple feeder lines 118 (e.g., plant-level events generally impact multiple feeders), second-order filtering may then be performed to improve the rough mapping. Such second-order filter may include analyzing periodically reported data (such as AC voltage and frequency) across multiple DGs 106 that reported the same status message or messages in order to identify like-kind voltage and frequency levels and thereby associate those DGs 106 to a particular feeder line 118. In order to compensate for slight clock differences among the inverters 110, time windows may be established for use in the data correlation (e.g., events occurring within 30 seconds of each other may be correlated). By such analysis of the DG data, data signatures can be determined for those DGs 106 on a particular feeder line 118.

In addition to identifying which DGs 106 are coupled to which feeder lines 118, the DG data can be used to obtain a geographical layout corresponding to each feeder line 118. Once a group of DGs 106 is associated to a particular feeder line 118, the voltage at the point of interconnect between each DG 106 and the corresponding feeder line 118 can be computed. Since the voltage level on the feeder line drops along the length of the feeder line 118, the DGs 106 can thus be ordered to determine a geographical layout of the feeder line; for example, a map depicting the geographical layout of the feeder line 118 and the DGs 106 on that feeder may be generated. Known geographical data (such as street addresses of one or more buildings 120), GPS data provided by one or more inverters 110 (e.g., longitude and latitude), or other types of geographical data may be additionally used in generating such a layout and/or map.

Such knowledge of DG/feeder coupling and/or geographical layout (as well as the data used to generate such information) may be used, for example, in power curtailment (e.g., one or more DGs 106 on a particular feeder line 118, or a particular geographical region of DGs 106, may be remotely controlled by the master controller 124 to turn power generation down or off as needed by the utility company), for providing feeder line voltage data to the corresponding utility company (e.g., voltage drop along the feeder lines 118, feeder line voltage levels that are over or under nominal levels by a certain percentage, feeder lines 118 susceptible to having out-of-spec voltages, or the like), for determining particular feeder lines 118 having high numbers of anomalies that result in inverter damage (e.g., for use in determining root causes of inverter failures and/or inverter warranty-related information), and the like.

Further, by identifying which DGs 106 are coupled to which feeder lines 118, various feeder-level statistics can be determined. For example, for the DGs 106 on a particular feeder line 118, the collective impact on the grid voltage can be determined (e.g., it may be determined that the grid voltage is impacted at most by a certain percentage during sudden clouding). As another example, for the DGs 106 on a particular feeder line 118, power production by the DGs 106 can be aggregated to determine aggregated power production over various periods of time; e.g., an aggregated power production curve can be determined to show the aggregated DG power production on a particular feeder line by time of day. Such a curve may be determined for one or more days during particular seasons, such as a daily aggregated power production curve for a summer day or a winter day. The aggregated power production data may be used for providing additional insight to the corresponding utility company regarding the feeder lines 118. For example, actual DG power production data on various feeder lines 118 may be used to identify those feeder lines 118 that are capable of supporting additional DGs. Further, such DG power production data may be used along with data on feeder current flow (e.g., obtained by a current meter coupled to each feeder line 118) for improved demand management.

In some embodiments, stored data may be retrieved to perform the analysis described above; alternatively, real-time data or a combination of stored data/real-time data may be analyzed.

Figure 2:
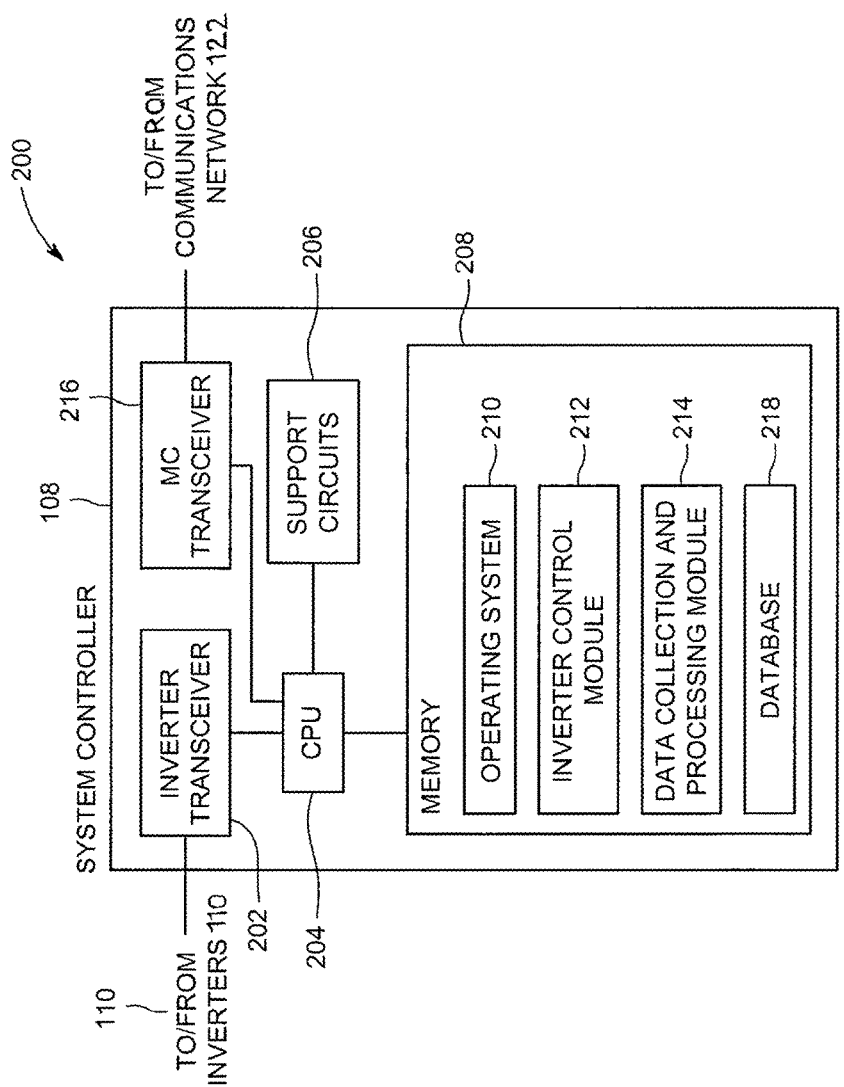
FIG. 2 is a block diagram of a controller in accordance with one or more embodiments of the present invention.

FIG. 2 is a block diagram of a controller 108 in accordance with one or more embodiments of the present invention. The controller 108 comprises a master controller transceiver 216 communicatively coupled to the communications network 122, and an inverter transceiver 202 communicatively coupled to the inverters 110. The transceivers 202 and 216 may utilize wireless (e.g., based on standards such as IEEE 802.11, Zigbee, Z-wave, or the like) and/or wired (e.g., PLC) communication techniques for such communication, for example a WI-FI or WI-MAX modem, 3G modem, cable modem, Digital Subscriber Line (DSL), fiber optic, or similar type of technology.

The controller 108 further comprises at least one central processing unit (CPU) 204 coupled to each of the inverter transceiver 202, the master controller transceiver 216, support circuits 206, and a memory 208. The CPU 204 may comprise one or more conventionally available microprocessors; alternatively, the CPU 204 may include one or more application specific integrated circuits (ASIC). In some embodiments, the CPU 204 may be a microcontroller comprising internal memory for storing controller firmware that, when executed, provides the controller functionality herein. The controller 108 may be implemented using a general purpose computer that, when executing particular software, becomes a specific purpose computer for performing various embodiments of the present invention.

The support circuits 206 are well known circuits used to promote functionality of the CPU 204. Such circuits include, but are not limited to, a cache, power supplies, clock circuits, buses, network cards, input/output (I/O) circuits, and the like.

The memory 208 may comprise random access memory, read only memory, removable disk memory, flash memory, and various combinations of these types of memory. The memory 208 is sometimes referred to as main memory and may, in part, be used as cache memory or buffer memory. The memory 208 generally stores an operating system (OS) 210 of the controller 108. The OS 210 may be one of a number of available operating systems for microcontrollers and/or microprocessors.

The memory 208 may store various forms of application software, such as an inverter control module 212 for providing operative control of the inverters 110 (e.g., providing command instructions to the inverters 110 regarding power production levels). The memory 208 further comprises a data collection/processing module 214 for collecting and processing data as described herein. The memory 208 may also store a database 218 for storing data related to the operation of the inverters 110 and/or the present invention, such as geographical data pertaining to the DGs 106 (e.g., street addresses of the DGs 106, longitude and latitude data pertaining to the DGs, and the like).

Figure 3:
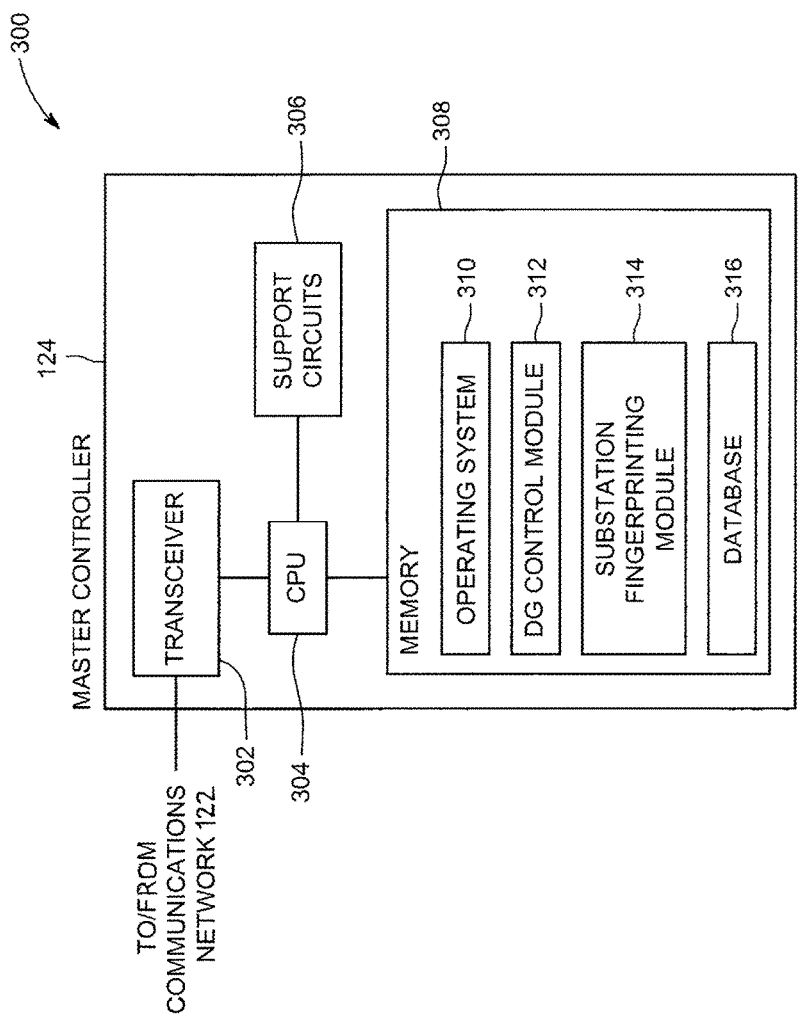
FIG. 3 is a block diagram of a master controller in accordance with one or more embodiments of the present invention.

FIG. 3 is a block diagram of a master controller 124 in accordance with one or more embodiments of the present invention. The master controller 124 comprises a transceiver 302 communicatively coupled to the communications network 122. The transceiver 302 may utilize wireless (e.g., based on standards such as IEEE 802.11, Zigbee, Z-wave, or the like) and/or wired communication techniques for such communication, for example a WI-FI or WI-MAX modem, 3G modem, cable modem, Digital Subscriber Line (DSL), fiber optic, PLC, or similar type of technology.

The master controller 124 further comprises at least one central processing unit (CPU) 304 coupled to each of the transceiver 302, support circuits 306, and a memory 308. The CPU 304 may comprise one or more conventionally available microprocessors; alternatively, the CPU 304 may include one or more application specific integrated circuits (ASIC). In some embodiments, the CPU 304 may be a microcontroller comprising internal memory for storing controller firmware that, when executed, provides the controller functionality herein. The master controller 124 may be implemented using a general purpose computer that, when executing particular software, becomes a specific purpose computer for performing various embodiments of the present invention.

The support circuits 306 are well known circuits used to promote functionality of the CPU 304. Such circuits include, but are not limited to, a cache, power supplies, clock circuits, buses, network cards, input/output (I/O) circuits, and the like.

The memory 308 may comprise random access memory, read only memory, removable disk memory, flash memory, and various combinations of these types of memory. The memory 308 is sometimes referred to as main memory and may, in part, be used as cache memory or buffer memory. The memory 308 generally stores an operating system (OS) 310 of the master controller 124. The OS 310 may be one of a number of available operating systems for microcontrollers and/or microprocessors.

The memory 308 may store various forms of application software, such as a DG control module 312 for providing operative control of one or more DGs 106 (e.g., providing command instructions to one or more DGs 106 regarding power production levels). The memory 308 further comprises a substation fingerprinting module 314 for performing the analysis and correlation as described herein, as well as producing the resulting outputs (e.g., a geographical map of feeder line layout) described herein; further detail on the functionality provided by the substation fingerprinting module 314 is described below with respect to FIG. 4. The memory 308 may also store a database 316 for storing data related to the operation of one or more DGs 106 and/or the present invention (e.g., inverter status messages, AC voltage/frequency/current information for one or more inverters 110, and the like).

Figure 4:
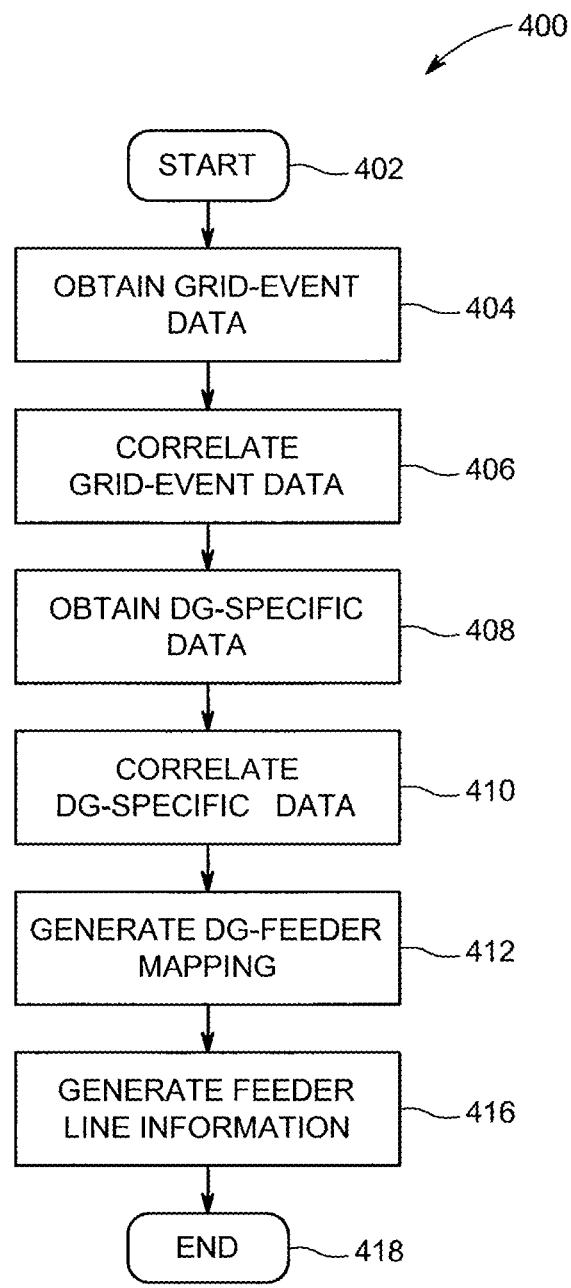
FIG. 4 is a flow diagram of a method for substation fingerprinting in accordance with one or more embodiments of the present invention.

FIG. 4 is a flow diagram of a method 400 for substation fingerprinting in accordance with one or more embodiments of the present invention. In one embodiment, the method 400 is an implementation of the substation fingerprinting module 314. In some embodiments, a computer readable medium comprises a program that, when executed by a processor, performs at least a portion of the method 400 that is described in detail below.

The method 400 is directed, in part, to determining a mapping of distributed generators (DGs) to feeder lines for a power distribution system, such as the system 100 described above. As previously described with respect to FIG. 1, the DGs may comprise any type of renewable energy source (RES) for generating DC power that is then converted to AC power by one or more DC-AC inverters. The generated AC power in coupled to a feeder line of the power distribution system, for example by a load center. Also as previously described with respect to FIG. 1, each DG comprises a system controller communicatively coupled to a master controller (e.g., the system controller 108 and the master controller 124). The master controller generally performs the data analysis and correlation described herein, using data received from the DG system controllers, to determine the DG-to-feeder line mapping and generate one or more outputs based on such mapping (e.g., a map of DG/feeder line geographical layout, grid-related data, and the like).

The method 400 starts at step 402 and proceeds to step 404. At step 404, grid-event data is obtained. Such data may include status messages generated by inverters due to grid perturbances (such as an 'AC voltage out-of-range' message from one or more inverters due to a sudden large drop in grid voltage). The grid-event data may be retrieved from a database (e.g., a database of the master controller). The method 400 proceeds to step 406, where the grid-event data is correlated in a first-order filtering for identifying potential groupings of DGs coupled to feeder lines. Generally, geographical data such as street addresses of the DGs, longitude and latitude data pertaining to the DGs, and the like, is used during analysis of the grid-event data to correlate the geographical proximity of the grid-event data. Such geographical correlation ensures that the grid-event data utilized in the substation fingerprinting is from the same geographical region. In some embodiments, a rough mapping of DGs-to-feeder lines may be generated from the grid-event data.

At step 408, DG-specific data is obtained. The DG-specific data may include data regarding the health and/or performance of inverters within the DGs (such as power generated, voltage generated, current generated, alarm information, alert information, status information, and the like) as well as data obtained by the inverters that pertains to the feeder lines (such as line voltage, line frequency, and the like). The DG-specific data may be retrieved from a database (e.g., a database of the master controller of databases of system controllers); additionally or alternatively, some or all of the DG-specific data may be obtained in real-time (e.g., the DG-specific data may be periodically reported at regular intervals).

The method 400 proceeds to step 410, where the DG-specific data is correlated in a second-order filtering to determine the DG/feeder line mappings. Geographical data may also be used during the analysis of the DG-specific data for correlating the geographical proximity of the DG-specific data. In some embodiments, a rough mapping of DGs-to-feeder lines generated from the grid-event data may be fine-tuned using the DG-specific data (e.g., performance level data such as voltage, frequency, and the like, may be used to improve the rough mapping or fill in areas of the rough mapping where voltage swings are present in the data but weren't severe enough to trigger an event on the inverter). The DG-specific data correlation may include analyzing periodically reported data from inverters (such as AC voltage and frequency) across multiple DGs that reported the same status message or messages (i.e., the grid-event data) in order to identify like-kind voltage and frequency levels and thereby associate those DGs to a particular feeder line. In order to compensate for slight clock differences among the inverters, time windows may be established for use in the data correlation (e.g., events occurring within 30 seconds of each other may be correlated). Such analysis of the grid-event data and the DG-specific data generates data signatures that identify which DGs are on the same feeder line. Although the data analysis/correlation of the grid-event data and the DG-specific data are described as two different steps of the method 400, in some embodiments the grid-event data and the DG-specific data may be analyzed together.

The method 400 proceeds to step 412 where a DG-to-feeder line mapping is generated (e.g., as previously described with respect to FIG. 1). Such a mapping may be in the form of a data table or report (e.g., indicating which DGs are coupled to which feeder lines), a geographical map (e.g., a map depicting the geographical layout of the DGs and feeder lines), or the like. At step 414, feeder line information is generated as needed (e.g., as previously described with respect to FIG. 1). For example, data may be generated for the corresponding utility company regarding feeder line voltage levels, aggregated power generation by DGs for one or more feeder lines, or the like. The method 400 then proceeds to step 418 where it ends.

In some other embodiments of the method 400, grid-event data may be sufficient for determining the DG/feeder line mappings (for example, a large enough number of grid anomalies (such as voltage spikes) that trigger inverter events may generate sufficient data for a mapping to be generated).

The foregoing description of embodiments of the invention comprises a number of elements, devices, circuits and/or assemblies that perform various functions as described. These elements, devices, circuits, and/or assemblies are exemplary implementations of means for performing their respectively described functions.

While the foregoing is directed to embodiments of the present invention, other and further embodiments of the invention may be devised without departing from the basic scope thereof, and the scope thereof is defined by the claims that follow.

The invention claimed is:

1. A method for mapping distributed generators (DGs) to corresponding power grid feeder lines, comprising:
    obtaining, by a controller communicatively coupled to a plurality of distributed generators (DGs), grid data pertaining to a power grid that comprises a plurality of feeder lines coupled to the plurality of DGs;
    obtaining, by the controller, for each distributed generator (DG) of the plurality of DGs, DG data generated by and pertaining to the DG; and
    determining, based on the grid data and the DG data, a mapping that identifies to which feeder line of the plurality of feeder lines each of the DGs of the plurality of DGs is coupled.

2. The method of claim 1, wherein determining the mapping comprises:
    correlating the grid data to generate an initial mapping that identifies potential relationships between one or more DGs of the plurality of DGs and one or more feeder lines of the plurality of feeder lines; and
    refining the initial mapping, based on the DG data, to generate the mapping, wherein geographical data pertaining to the plurality of DGs is used in at least one of correlating the grid data or refining the initial mapping.

3. The method of claim 1, wherein the grid data comprises status messages, generated by one or more of the DGs of the plurality of DGs, that indicate perturbances on the power grid.

4. The method of claim 3, wherein the DG data comprises periodically generated data from one or more inverters of each DG of the plurality of DGs.

5. The method of claim 1, further comprising remotely controlling power generation by at least one DG of the plurality of DGs based on the mapping.

6. The method of claim 1, wherein the mapping comprises a geographical layout of the plurality of feeder lines.

7. The method of claim 6, wherein the geographical layout is generated by determining, for each feeder line of the plurality of feeder lines and based on voltage level along the feeder line, a geographical position of one or more DGs coupled to the feeder line.

8. Apparatus for mapping distributed generators (DGs) to corresponding power grid feeder lines, comprising:
 a controller, communicatively coupled to a plurality of DGs, for (i) obtaining grid data pertaining to a power grid that comprises a plurality of feeder lines; (ii) obtaining, for each DG of the plurality of DGs, DG data generated by and pertaining to the DG, wherein the plurality of DGs is coupled to the plurality of feeder lines; and (iii) determining, based on the grid data and the DG data, a mapping that identifies to which feeder line of the plurality of feeder lines each of the DGs of the plurality of DGs is coupled.

9. The apparatus of claim 8, wherein the controller determines the mapping by (a) correlating the grid data to generate an initial mapping that identifies potential relationships between one or more DGs of the plurality of DGs and one or more feeder lines of the plurality of feeder lines; and (b) refining the initial mapping, based on the DG data, to generate the mapping, wherein geographical data pertaining to the plurality of DGs is used in at least one of correlating the grid data or refining the initial mapping.

10. The apparatus of claim 8, wherein the grid data comprises status messages, generated by one or more of the DGs of the plurality of DGs, that indicate perturbances on the power grid.

11. The apparatus of claim 10, wherein the DG data comprises periodically generated data from one or more inverters of each DG of the plurality of DGs.

12. The apparatus of claim 8, wherein the controller further remotely controls power generation by at least one DG of the plurality of DGs based on the mapping.

13. The apparatus of claim 8, wherein the mapping comprises a geographical layout of the plurality of feeder lines.

14. The apparatus of claim 13, wherein the geographical layout is generated by determining, for each feeder line of the plurality of feeder lines and based on voltage level along the feeder line, a geographical position of one or more DGs coupled to the feeder line.

15. A computer readable medium comprising a program that, when executed by a processor, performs a method of mapping distributed generators (DGs) to corresponding power grid feeder lines, the method comprising:
 obtaining grid data pertaining to a power grid that comprises a plurality of feeder lines;
 obtaining, for each distributed generator (DG) of a plurality of DGs coupled to the plurality of feeder lines, DG data generated by and pertaining to the DG; and
 determining, based on the grid data and the DG data, a mapping that identifies to which feeder line of the plurality of feeder lines each of the DGs of the plurality of DGs is coupled.

16. The computer readable medium of claim 15, wherein determining the mapping comprises:
 correlating the grid data to generate an initial mapping that identifies potential relationships between one or more DGs of the plurality of DGs and one or more feeder lines of the plurality of feeder lines; and
 refining the initial mapping, based on the DG data, to generate the mapping, wherein geographical data pertaining to the plurality of DGs is used in at least one of correlating the grid data or refining the initial mapping.

17. The computer readable medium of claim 15, wherein the grid data comprises status messages, generated by one or more of the DGs of the plurality of DGs, that indicate perturbances on the power grid.

18. The computer readable medium of claim 17, wherein the DG data comprises periodically generated data from one or more inverters of each DG of the plurality of DGs.

19. The computer readable medium of claim 15, wherein the mapping comprises a geographical layout of the plurality of feeder lines.

20. The computer readable medium of claim 19, wherein the geographical layout is generated by determining, for each feeder line of the plurality of feeder lines and based on voltage level along the feeder line, a geographical position of one or more DGs coupled to the feeder line.

* * * * *